United States Patent
Wu (10) Patent No.: US 7,011,987 B2
(45) Date of Patent: Mar. 14, 2006

(54) METHOD OF FABRICATING ORGANIC ELECTROLUMINESCENCE PANEL PACKAGE

(75) Inventor: Chin-Long Wu, Tainan (TW)

(73) Assignee: RiTdisplay Corporation, Hsinchu (TW)

( * ) Notice: Subject to any disclaimer, the term of this patent is extended or adjusted under 35 U.S.C. 154(b) by 80 days.

(21) Appl. No.: 10/612,608

(22) Filed: Jul. 1, 2003

(65) Prior Publication Data

US 2005/0003578 A1   Jan. 6, 2005

(51) Int. Cl.
*H01L 21/44* (2006.01)

(52) U.S. Cl. .......................... 438/108; 257/40; 257/41; 257/42; 257/43

(58) Field of Classification Search ........ 257/734–739, 257/40–44; 438/108, 82, 89
See application file for complete search history.

(56) References Cited

U.S. PATENT DOCUMENTS 5,866,950 A * 2/1999 Iwasaki et al. ............. 257/782
6,274,978 B1 * 8/2001 Roach et al. ............... 313/483
2002/0173215 A1 * 11/2002 Freidhoff et al. ............. 445/24
2003/0127720 A1 * 7/2003 Fang ........................... 257/686
2003/0160310 A1 * 8/2003 Langhorn .................... 257/678
2004/0056072 A1 * 3/2004 Chapman et al. ......... 228/180.5
2004/0173899 A1 * 9/2004 Peng et al. .................. 257/734
2004/0188813 A1 * 9/2004 Agraharam et al. ........ 257/678

* cited by examiner

*Primary Examiner*—Hoai Pham
*Assistant Examiner*—Nathan W. Ha
(74) *Attorney, Agent, or Firm*—J.C. Patents (57) ABSTRACT

A packaging fabrication for an organic electroluminescence panel is disclosed. The panel comprises a printed circuit board, one or a plurality of OEL panels and a plurality of bumps, wherein the OEL is provided with poly solder interconnections in area array. The printed circuit board is provided with a plurality of solder pads arranged with bumps. One or a plurality of OEL is arranged on the printed circuit board and the poly solder interconnections and bumps are used to electrically connect the OEL with the printed circuit board. Further, the excellent heat dissipation property of the low re-flow temperature of the poly solder interconnections and the ceramic printed circuit board provides packaging fabrication for low temperature low stress OEL.

6 Claims, 14 Drawing Sheets

METHOD OF FABRICATING ORGANIC ELECTROLUMINESCENCE PANEL PACKAGE

BACKGROUND OF THE INVENTION

1. Field of the Invention

The present invention relates to a method of fabricating an Organic Electroluminescence (OEL) panel package, and in particular, an organic electroluminescence panel package having area array poly solder interconnection.

2. Description of the Related Art

OEL devices employ the characteristics of self-illumination of organic functional materials to provide the displaying effect. Based on the differences of molecular weight of the organic functional material, there are two categories of OEL, namely small molecule OLED (SM-OLED), and polymer light-emitting device (PLED).

Organic electroluminescence devices use two electrodes to enclose organic film having light-emitting property. When an appropriate voltage is applied, holes will be injected from the anode and electrons will be injected from the cathode. Due to the externally added electric field, which causes potential difference, carriers within the film will move and produce recombination. A partial of energy released from the recombination of electrons and holes will excite the light-emitting molecule to form a single excited molecule. When the excited molecule releases energy and returns to the steady state, a certain proportion of energy will be released as light. This is the principle of light-emitting of OEL elements. The OEL element possesses self-emitting light, wide angle, high responsive speed, low driving voltage, and full color, and is known as the next generation flat display technology. Presently, the OEL element is at the stage of exploitation and in the future, it will be employed in the next generation color flat display, for example, all sizes of display panel, outdoor display panels, computers and TV screens, etc. However, the development of OEL is rather late as compared to that of the display, and the technology has not fully matured. Thus, there is room for improvement in the commercialization of the OEL display.

Figure 1:
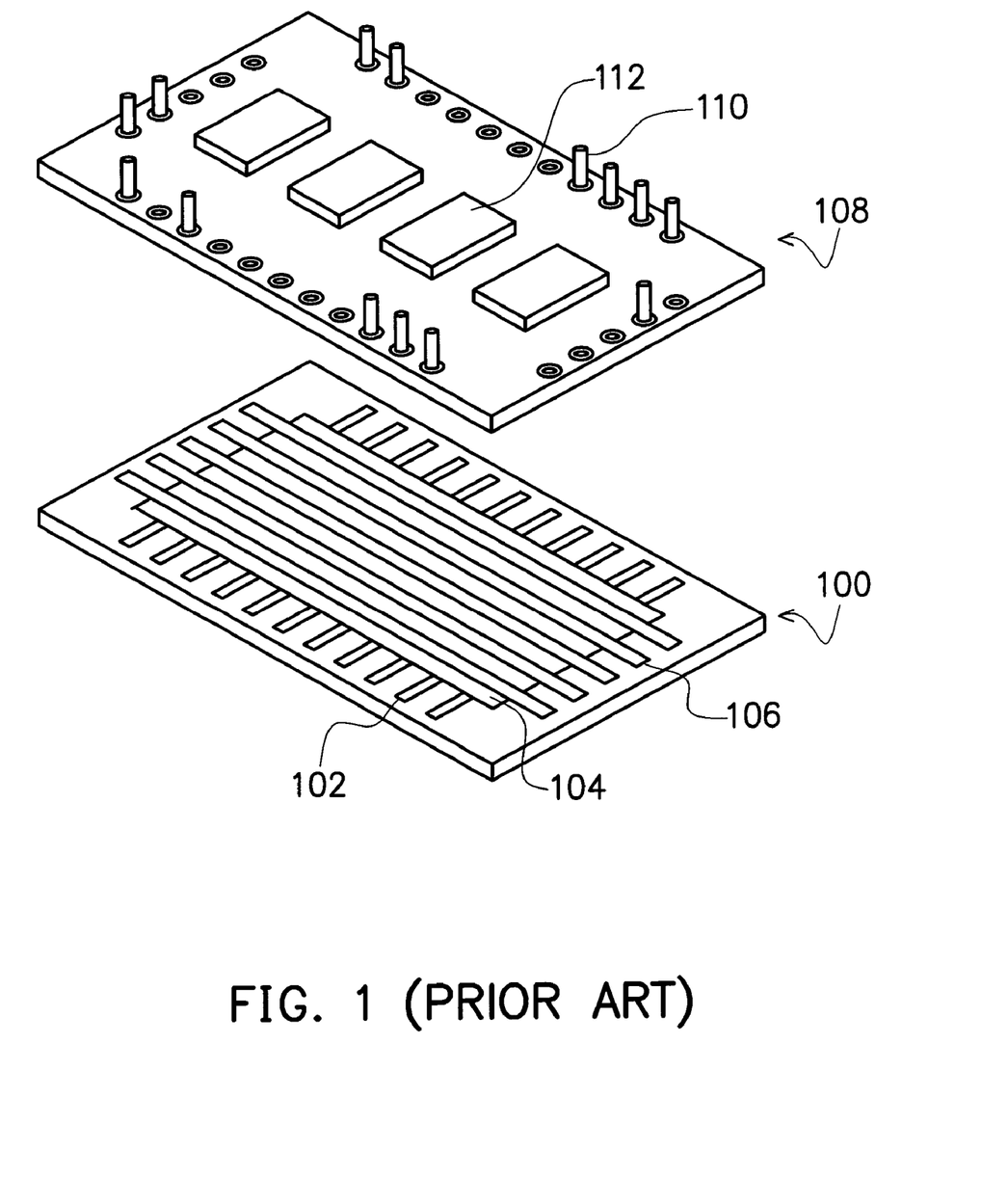
FIG. 1 is a schematic view of a conventional OEL packaging structure.

FIG. 1 shows a conventional OEL panel. U.S. Pat. No. 5,747,363 discloses a package structure of OEL panel comprising an OEL panel 100 and a substrate 108. The OEL panel 100 is provided with a plurality of stripe anodes 102, an organic light-emitting layer 104 and a plurality of stripe cathode 106. The substrate 108 is provided with a driving chip 112 and a plurality of pins 110. The pins 110 of the substrate 108 are electrically connected to the anode 102 of OEL panel 100 and to the cathode 106 by anisotropic conductive film.

Although the above package structure of OEL panel can effectively integrate the driving chip onto the substrate, there is still a limitation on the size.

Figure 2:
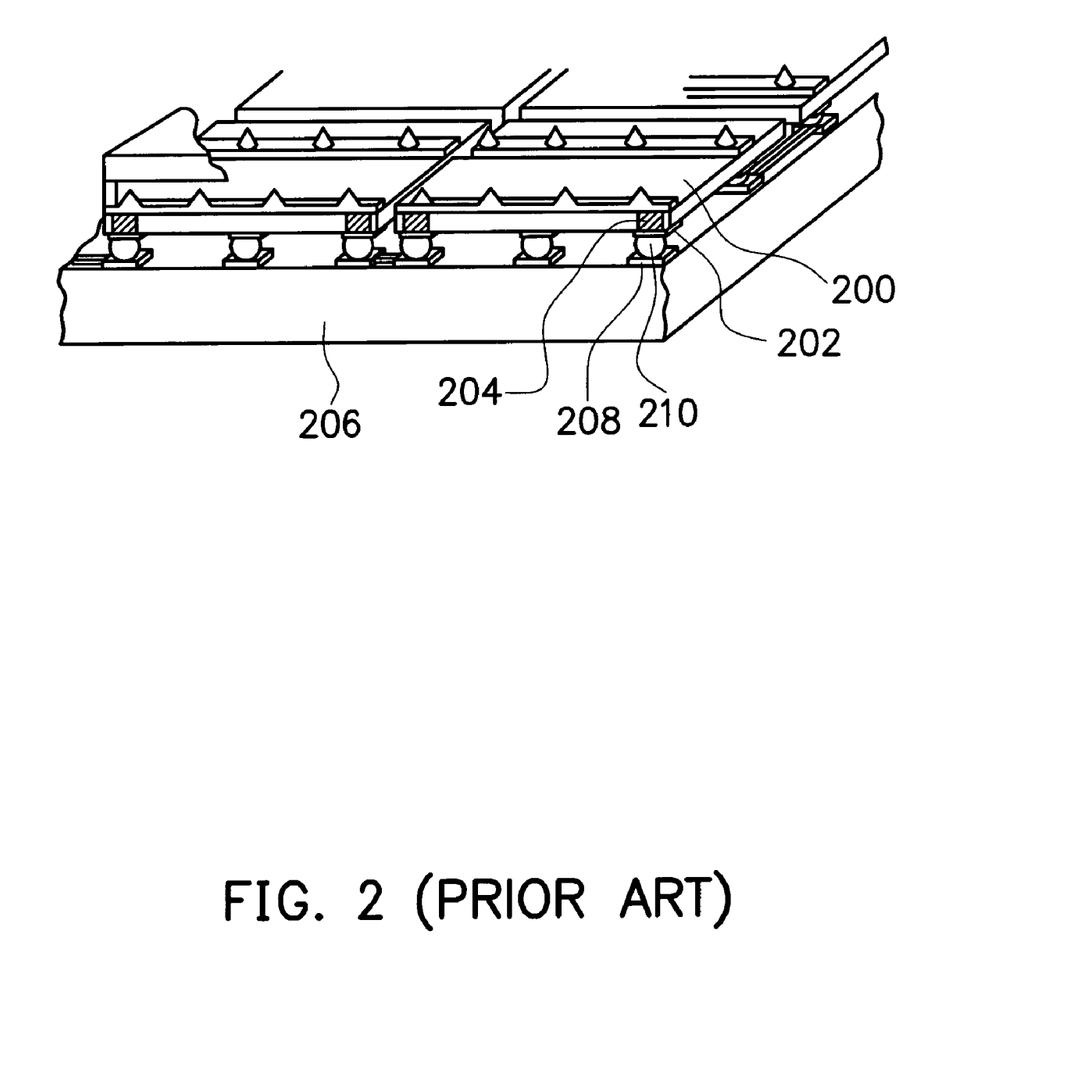
FIG. 2 is a schematic view of a conventional OEL packaging structure.

FIG. 2 is a schematic view showing the structure of a conventional OEL panel. U.S. Pat. No. 5,693,170 discloses package structure of an OEL panel comprising a plurality of display bricks 200, a common substrate 206 and a plurality of bumps 210. The surface of the common substrate 206 in proximity to the display bricks 200 is provided with a plurality of contact pads 202 which are electrically connected by means of a plug 204 with the electrodes of the display bricks 200. The common substrate 206 is arranged with a plurality of contact pads 208 corresponding to the contact pads 202. The bumps 210 are arranged between the contact pad 202 and the contact pad 208 for electrical connection.

The above package structure of OEL panel can be assembled from a plurality of display bricks to achieve the objective of a large size structure. However, the bonding between the contact pad and the bump is a high re-flow temperature process which will cause warpage to the common substrate, and the high temperature re-flow process will have unfavorable impact on the organic light-emitting layer of the OEL panel.

SUMMARY OF THE INVENTION

Accordingly, it is an object of the present invention to provide a method of fabricating an organic electroluminescence panel package, which possesses low stress problem and excellent heat dissipation property.

Yet another object of the present invention is to provide a method of fabricating an organic electroluminescence panel package, wherein a plurality of organic electroluminescence panels are mounted onto a same printed circuit board, breaking through the restriction of large sizing of OEL.

Another further object of the present invention is to provide a method of fabricating an organic electroluminescence panel package, which is a low temperature, low stress packaging fabrication process, in excellent compliance with the low temperature fabrication requirement of OEL.

In order to achieve the above objects, the present invention provides a method of fabricating an organic electroluminescence panel package, comprising the steps of:

providing a printed circuit board, for instance a ceramic printed circuit board, arranged with a plurality of solder pads;

forming bumps on the solder pads by, for example, the method of a wire bonding machine which is similar to the wire bonding process used to form stud bumps, for example gold bumps;

providing one or a plurality of OEL panels and mounting the OEL onto the printed circuit board; and performing a re-flow process to electrically connect the poly solder interconnection on the printed circuit board with the bumps.

In order to achieve the above object, the present invention provides a method of fabricating an organic electroluminescence panel package, comprising the steps of providing a substrate;

forming a first electrode on the substrate and the first electrode having a driving region and at least an interconnection region, and the interconnection region being protruded from the driving region;

forming at least a patterned organic light-emitting layer on the substrate, the patterned organic light-emitting layer exposing the interconnection region facilitating externally connection of the first electrode;

forming a second electrode on the organic light-emitting layer; and forming a plurality of poly solder interconnections on the interconnection region and the second electrode, wherein the poly solder interconnections are formed by screen printing or dispensing, and the poly solder interconnections are, for example, in an area array.

In accordance with the present invention, the driving region of the first electrode and the second electrode on the OEL panel, are, for example, in stripes, and the extension direction of the first electrode is, for example, perpendicular to the extension direction of the second electrode.

In accordance with the present invention, the patterned organic light-emitting layer, for example, is provided with a plurality of openings, such openings cause the interconnection region to be exposed, facilitating the external connection of the first electrode.

Further, in accordance with the present invention, the patterned organic light-emitting layer, for example, is a plurality of stripes exposing the interconnection region, facilitating external connection of the first electrode.

In accordance with the present invention, the OEL panel is a single-layered structure, for example, possessing a first electrode, an organic light-emitting layer and a second electrode.

In accordance with the present invention, in the fabrication of the OEL panel, in addition to the fabrication of the organic light-emitting layer, a holes injection layer, holes transmitting layer, electron injection layer and electron transmitting layer are fabricated, so as to fabricate a panel of multi-layers.

In accordance with the present invention, the substrate is a transparent substrate, for instance, glass substrate, plastic substrate, or flexible substrate, where the plastic substrate and the flexible substrate is polycarbonate (PC substrate), polyester substrate (PET), cyclic olefin copolymer substrate, metallocene-based cyclic olefin copolymer substrate or thin glass. The material for the first substrate is Indium Tin Oxide (ITO), Indium Zinc Oxide (IZO) or Aluminum Zinc Oxide (AZO). The material for the second electrode, is for example, metal. The poly solder interconnections can be "material of low re-flow temperature", for instance silver paste, gold paste, chrome paste, nickel paste, and the printed circuit board is, for example, ceramic printed circuit board, and the bump, for example, is a gold stud bump

DESCRIPTION OF THE DRAWINGS

The accompanying drawings are included to provide a further understanding of the invention, and are incorporated in and constitute a part of this specification. The drawings illustrate embodiments of the invention and, together with the description, serve the principles of the invention. In the drawings.

DESCRIPTION OF THE PREFERRED EMBODIMENTS

Reference will now be made in detail of the present preferred embodiments of the invention, examples of which are illustrated in the accompanying drawings. Wherever possible, the same reference numbers are used in the drawings and the description to refer to the same or like parts.

Figure 3:
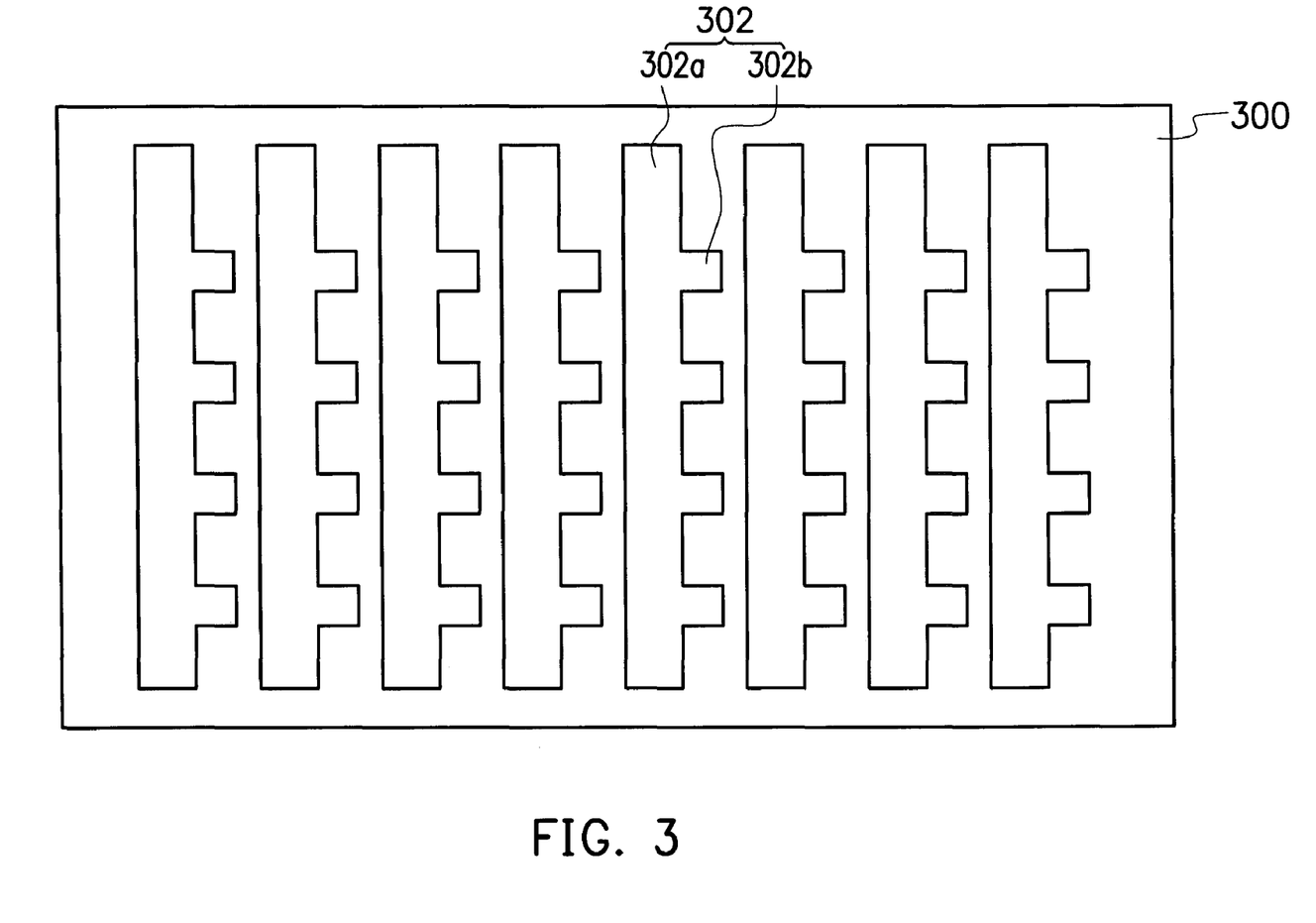
FIGS. 3 to 6 show the flowchart of fabricating OEL of the first preferred embodiment of the present invention.

Referring to FIGS. 3 to 6, there is shown schematically a flowchart of a first preferred embodiment of fabrication of an organic electroluminescence (OEL) panel in accordance with the present invention. Referring to FIG. 3, a transparent substrate 300 is provided and examples of transparent substrate 300 are glass or acrylate or other transparent materials. A plurality of anodes 302 are formed on the transparent substrate 300 and the anode 302 includes a driving region 302a and at least an interconnection region 302b. The material for anode 302 for example is Indium Tin Oxide (ITO) transparent conductive material. The driving region, for example, includes stripes, which are arranged mutually parallel on the transparent substrate 300. The interconnection region 302b is protruded from the driving region 302a for externally connection.

Figure 4:
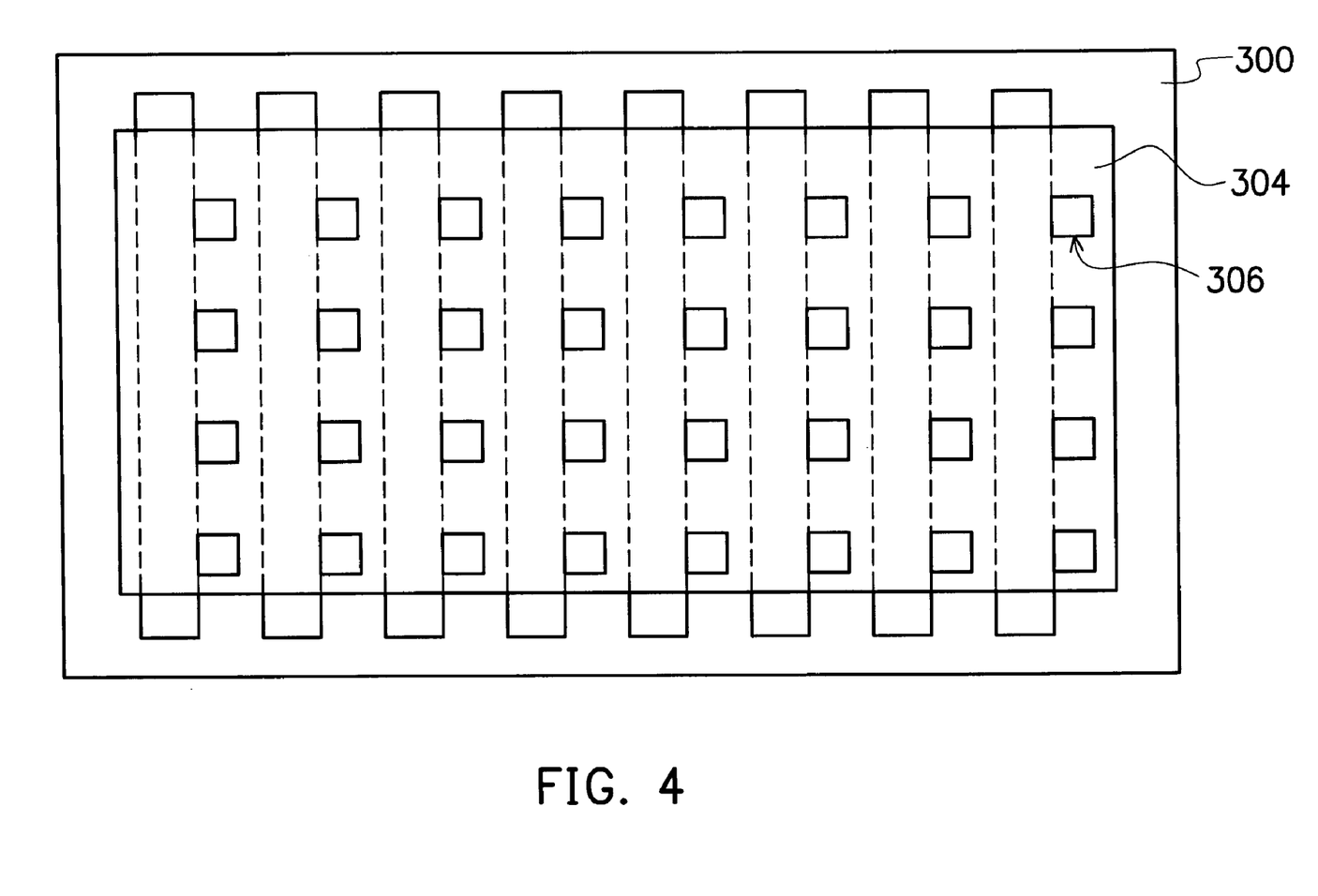

Next, referring to FIG. 4, after the anode 302 is formed, a patterned organic light-emitting layer 304 is formed on the transparent substrate 300. The patterned organic light-emitting layer 304, for example, is provided with a plurality of openings 306 at positions corresponding to that of the interconnection region 302b. The patterned organic light-emitting layer 304 for example is covered at the driving region 302a of the anode 302 and the openings 306 expose the interconnection region 302b of the anode 302.

Figure 5:
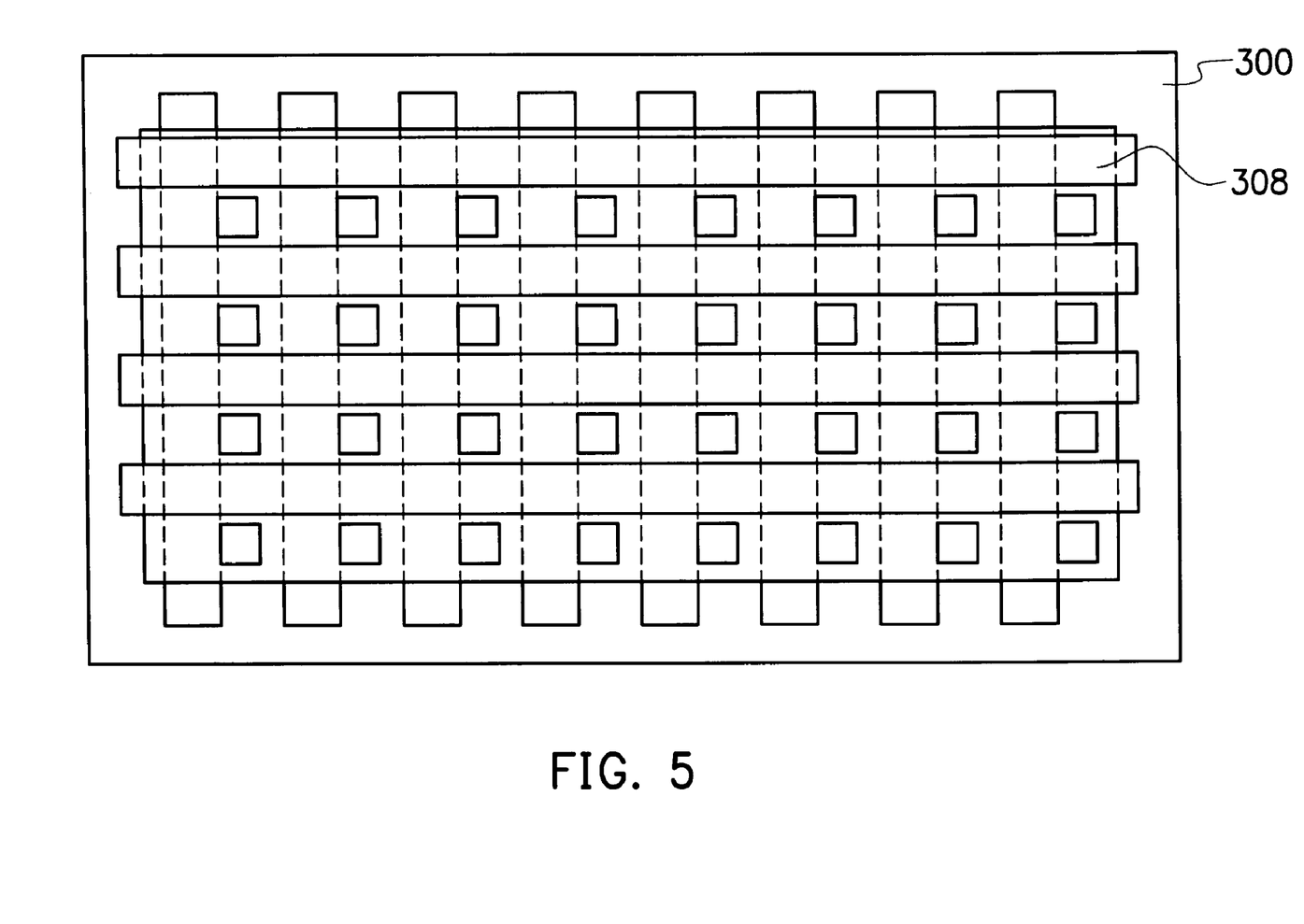

Next, referring to FIG. 5, after the patterned organic light-emitting layer 304 is formed, a plurality of cathodes 308 are formed thereon. The cathodes 308 for example are stripes and arranged mutually parallel on the patterned organic light-emitting layer 304. For example the cathode 308 is metallic material and the extension direction of the cathode 308, for example, is perpendicular to the extension direction of the driving region 302a of the anode 302. Besides, the distribution position of the cathode 308 in principle should not cover the exposed interconnection region 302b by the openings 306.

Figure 6:
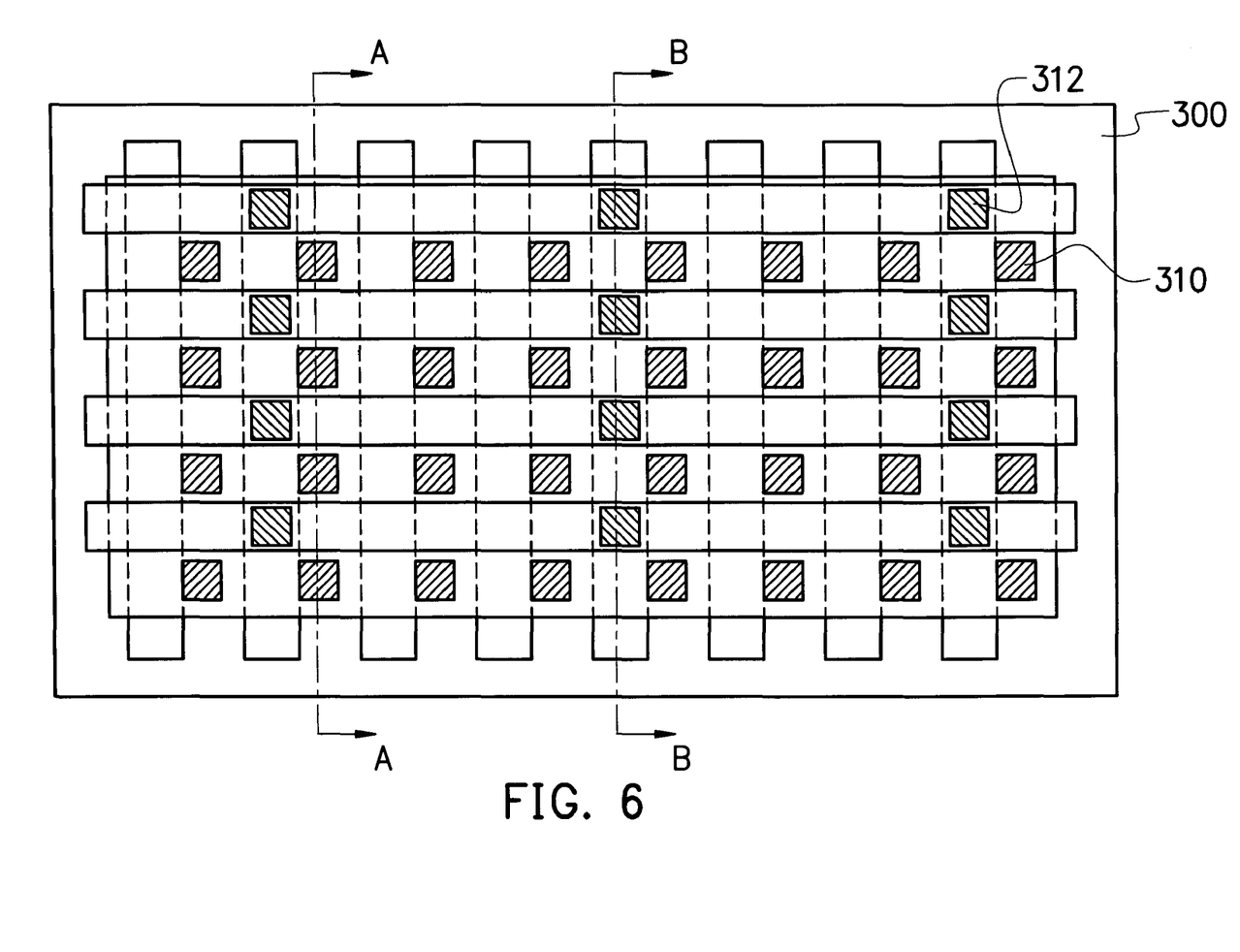

Next, referring to FIG. 6, after the formation of the cathode 308, poly solder interconnections 310 are formed on the interconnection region 302b exposed by the openings 306, and on an appropriate position of the cathode, at least a poly solder interconnection 312 is formed. Next, the material of poly solder interconnections 310, 312, for example is silver paste, which is a low re-flow temperature material (the re-flow temperature of silver paste is lower than 100° C.). The poly solder interconnection 310 electrically connects with the interconnection region 302b, and the poly solder interconnection 312 is electrically connected with the cathode 308. As can be clearly seen from the drawing, the anode 302 is externally connected by means of the poly solder interconnection 310 electrically connected to the interconnection region 302b, and the cathode 308 is externally connected by the poly solder interconnection 312. Further, the poly solder interconnections 310, 312 for example are in area array.

Figure 7A:
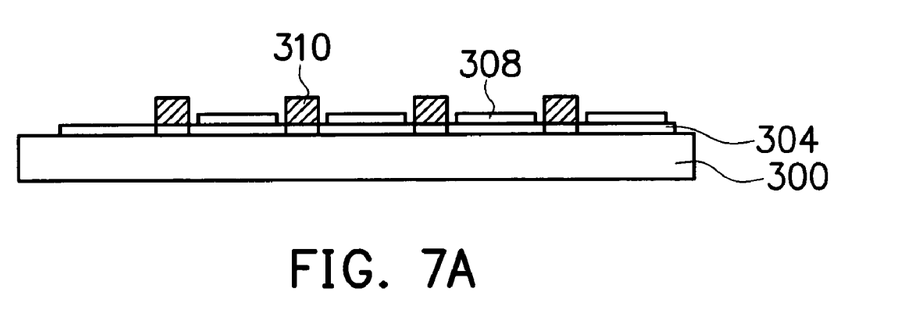
FIGS. 7A and 7B schematically show a sectional view of OEL of the first preferred embodiment of the present invention.
Figure 7B:
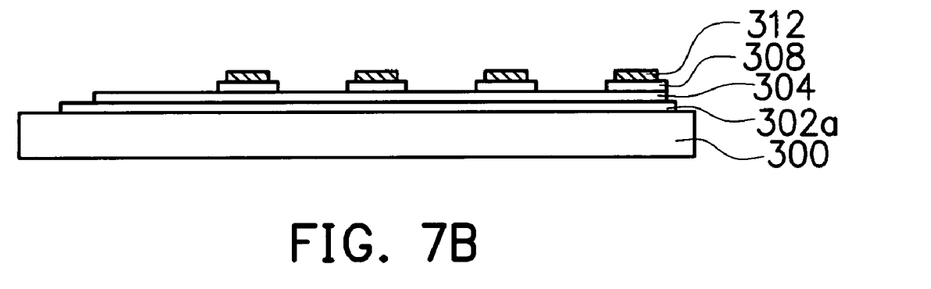

Next, referring to FIGS. 7A and 7B, there is shown schematically a sectional view of OEL of the first preferred embodiment. FIG. 7A shows the sectional view along line A—A of FIG. 6, and FIG. 7B shows the sectional view along line B—B of FIG. 6. As can be seen clearly from FIG. 7A, the interconnection region 302b of the anode 302 is externally connected by the poly solder interconnection 310, and from FIG. 7B, the cathode 308 is externally connected by the poly solder interconnection 312.

Figure 8A:
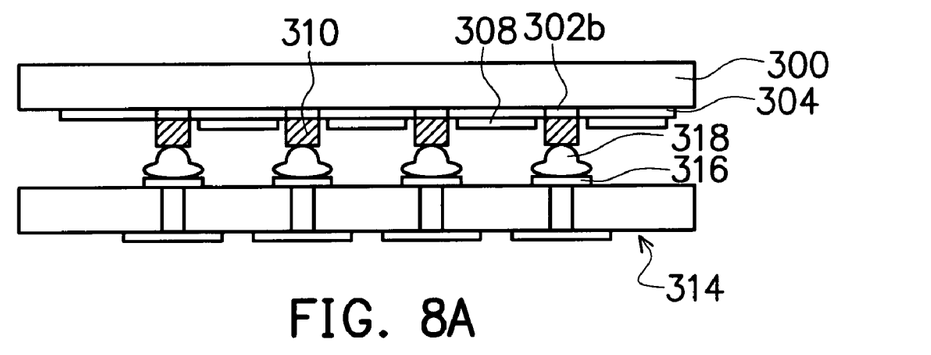
FIGS. 8A and 8B schematically show a sectional view of OEL the first preferred embodiment of the present invention.
Figure 8B:
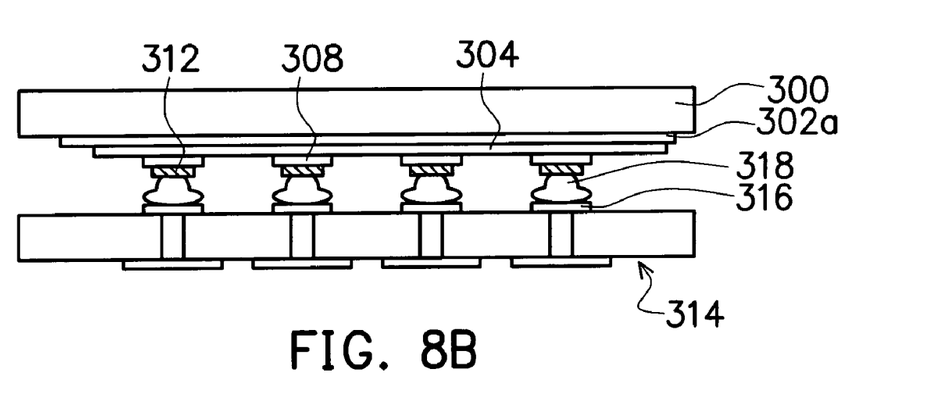

Next, referring to FIGS. 8A and 8B, there is shown a schematically sectional view of the structure of an OEL panel of the first preferred embodiment of the present invention. The OEL panel comprises a printed circuit board 314, a plurality of bumps 318 and one or a plurality of OEL panels, wherein the OEL panel is provided with an area array of poly solder interconnections 310, 312. The printed circuit board 314 is provided with a plurality of pads 316 and the corresponding trace thereof. The bump 318 for example is provided between the solder pad 316 and the poly solder interconnections 310, 312. In the preferred embodiment, a plurality of OEL panels are mounted on the printed circuit board 314 which breaks the restriction of the large sizing.

In the present preferred embodiment, the fabrication of an OEL panel comprises the steps of first providing a printed circuit board 314; forming bumps 318 on the solder pad 316 of the printed circuit board 314, wherein the bump 318 can be formed by means of a wire bonding machine similar to a wire bonding process to mount the bump 318 on the solder pad 316 to form stud bumps, and the bump 318 is a gold bump. However, to those skilled in the art, the bump 318 employed in the present preferred embodiment is not restricted to gold stud bumps but can be other bump configurations and materials.

Next, an OEL panel at least having poly solder interconnections 310, 312 are flipped such that the poly solder interconnections 310, 312 face the printed circuit board 314, and the poly solder interconnections 310, 312 and the bump 318 of the solder pad 316 are in alignment. After that, a re-flow process is performed such that the poly solder interconnections 310, 312 and the bump 318 are electrically connected. Due to the low re-flow temperature of the poly solder interconnections 310, 312 the bonding between the OEL panel and the printed circuit board 314 can be completed below 100° C., which is in compliance with the low temperature requirement of OEL panel.

Further, the above printed circuit board 314, for example, is a ceramic printed circuit board having excellent heat dissipation property, and use of the ceramic printed circuit board is beneficial to the heat dissipation mechanism of the OEL module.

Second Preferred Embodiment

Figure 9:
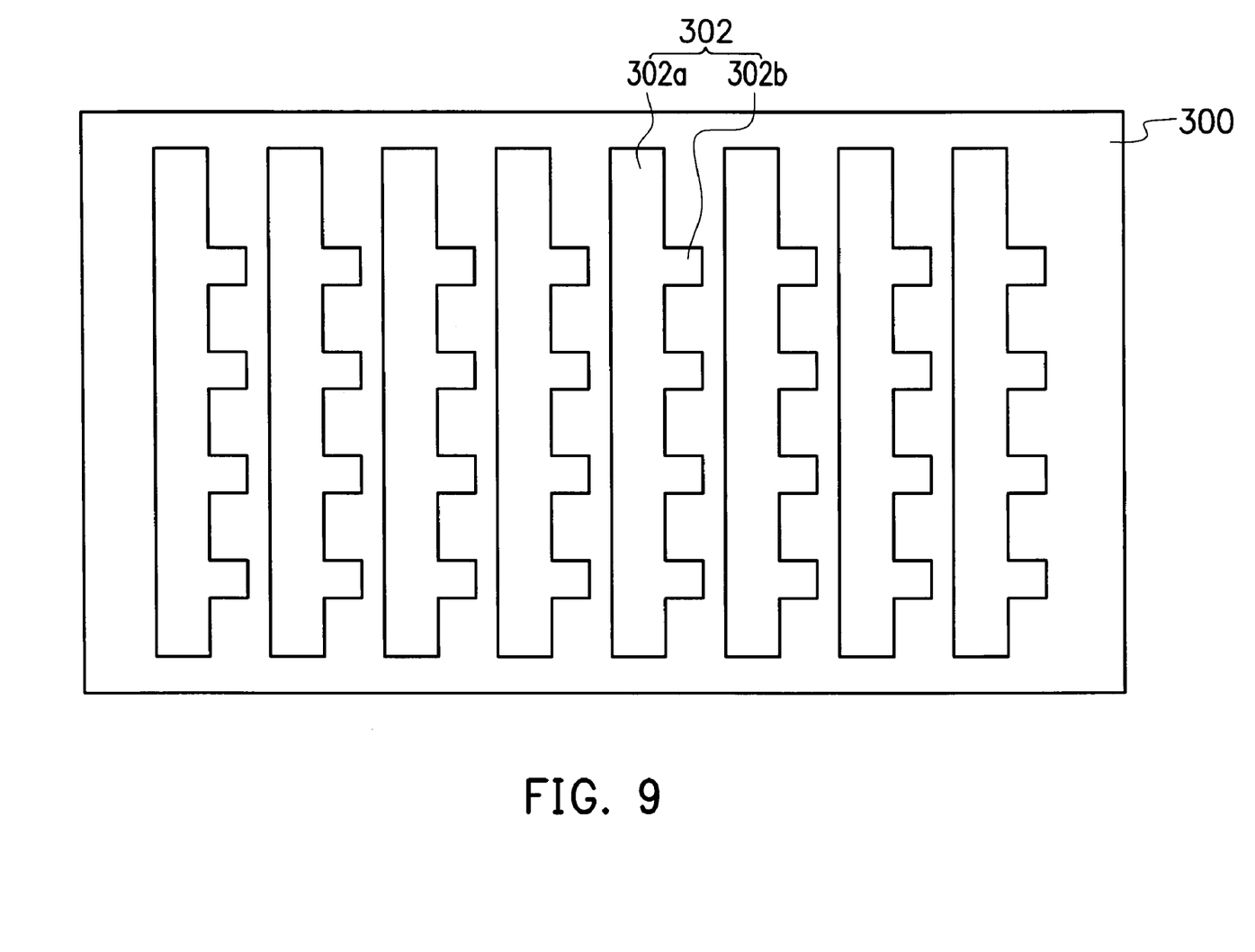
FIGS. 9 to 12 schematically show the flowchart of fabrication of OEL of the second preferred embodiment of the present invention.

Referring to FIGS. 9 to 12, there is shown schematically a flowchart of a second preferred embodiment of fabrication of an organic electroluminescence (OEL) panel in accordance with the present invention. Referring to FIG. 9, a transparent substrate 300 is provided and examples of transparent substrate 300 are glass or acrylate or other transparent materials. A plurality of anodes 302 are formed on the transparent substrate 300 and the anode 302 includes a driving region 302a and at least an interconnection region 302b. The material for the anode 302 is for example Indium Tin Oxide (ITO) transparent conductive material. The driving region 302a, for example, are stripes which are arranged mutually parallel on the transparent substrate 300. The interconnection region 302b is protruded from the driving region 302a for external connection.

Figure 10:
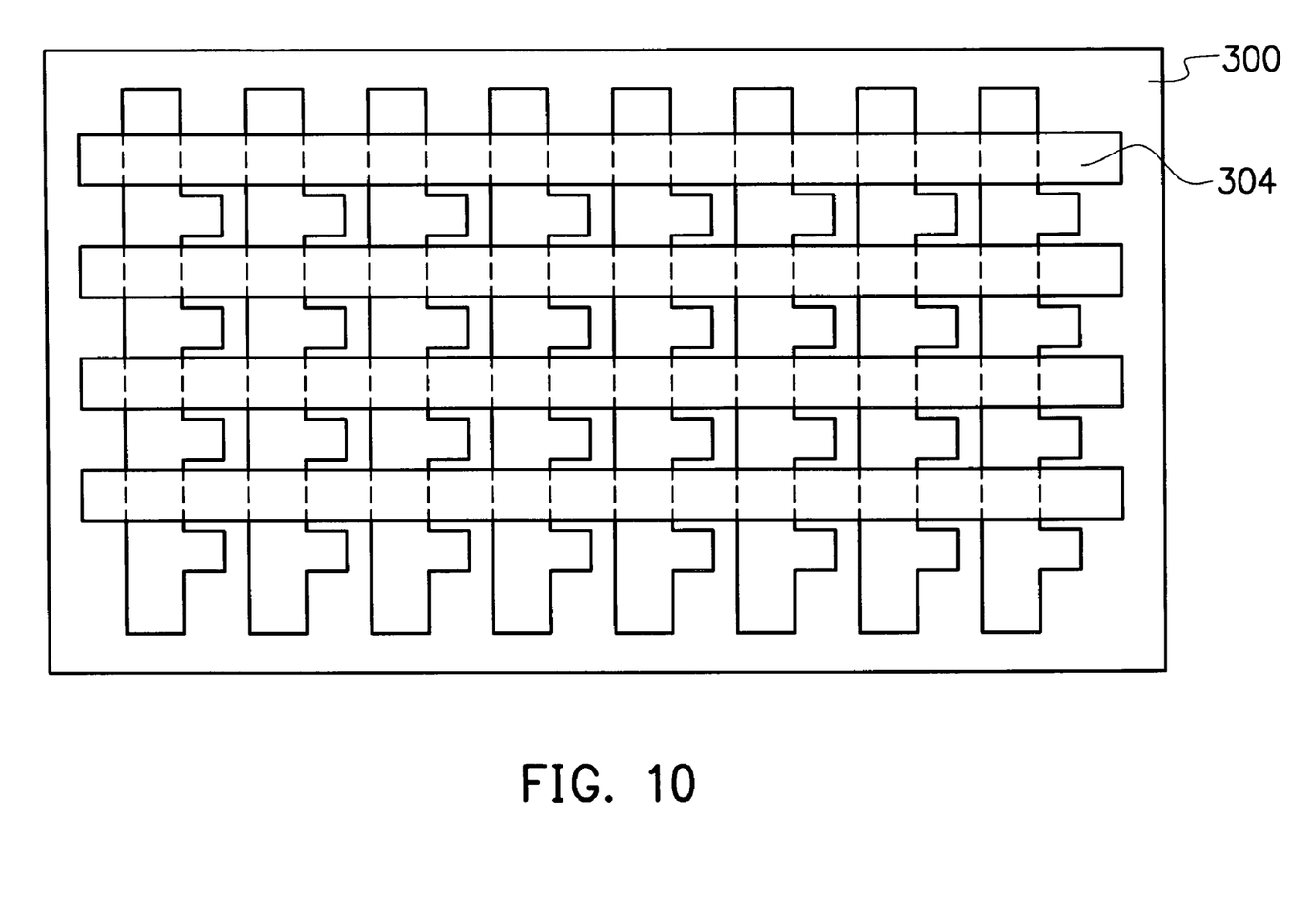

Next, referring to FIG. 10, after the anode 302 is formed, a patterned organic light-emitting layer 304 is formed on the transparent substrate 300. The patterned organic light-emitting layer 304 for example is in stripes and the distribution position in principle does not cover the interconnection region 302b so that the interconnection region 302b of the anode 302 is exposed.

Figure 11:
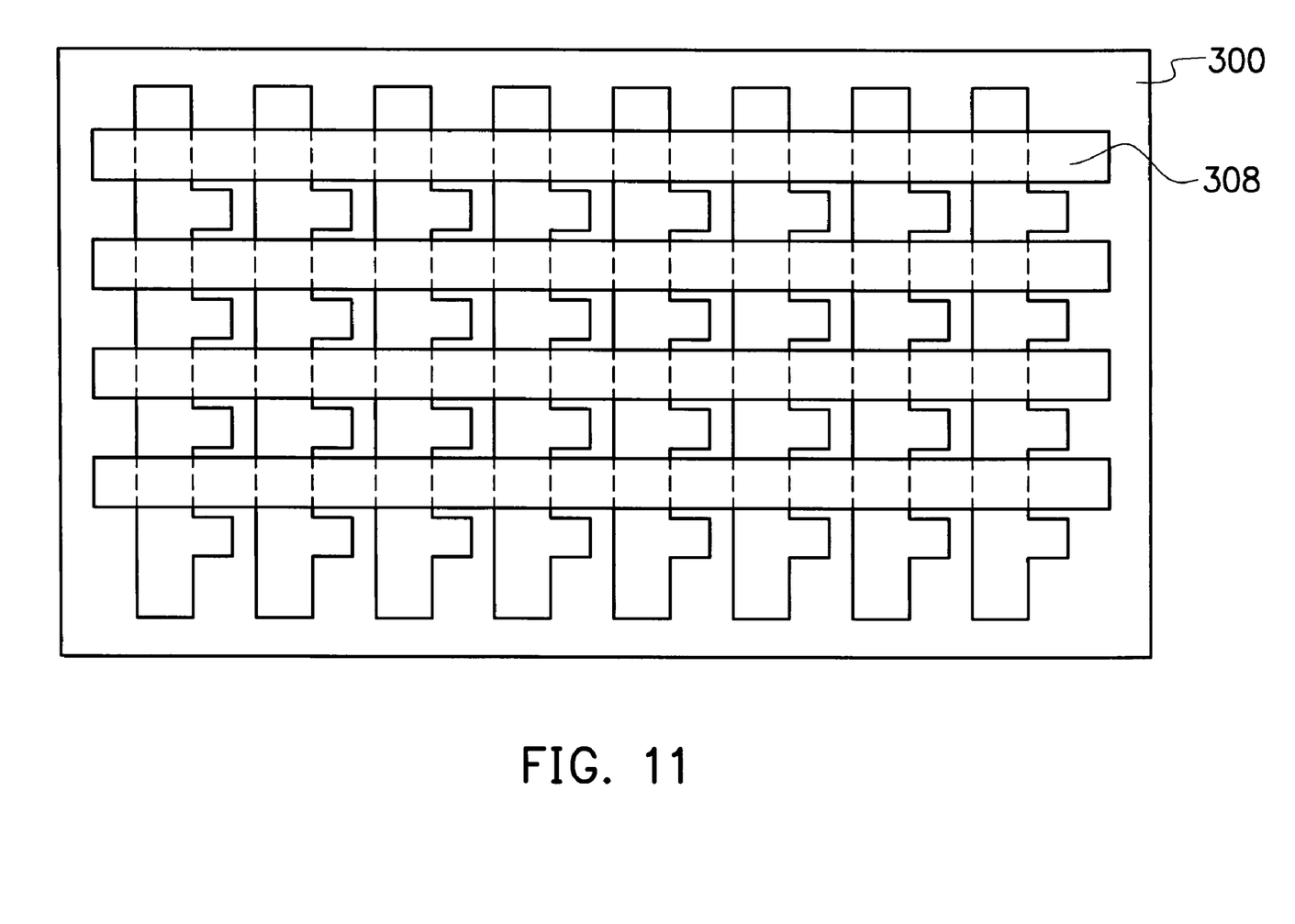

Next, referring to FIG. 11, after the patterned organic light-emitting layer 304 is formed, a plurality of cathodes 308 are formed thereon. The cathodes 308 for example are stripes similar to that of the OEL layer 304 and the extension direction of the cathode 308 for example, is perpendicular to the extension direction of the driving region 302a of the anode 302.

Figure 12:
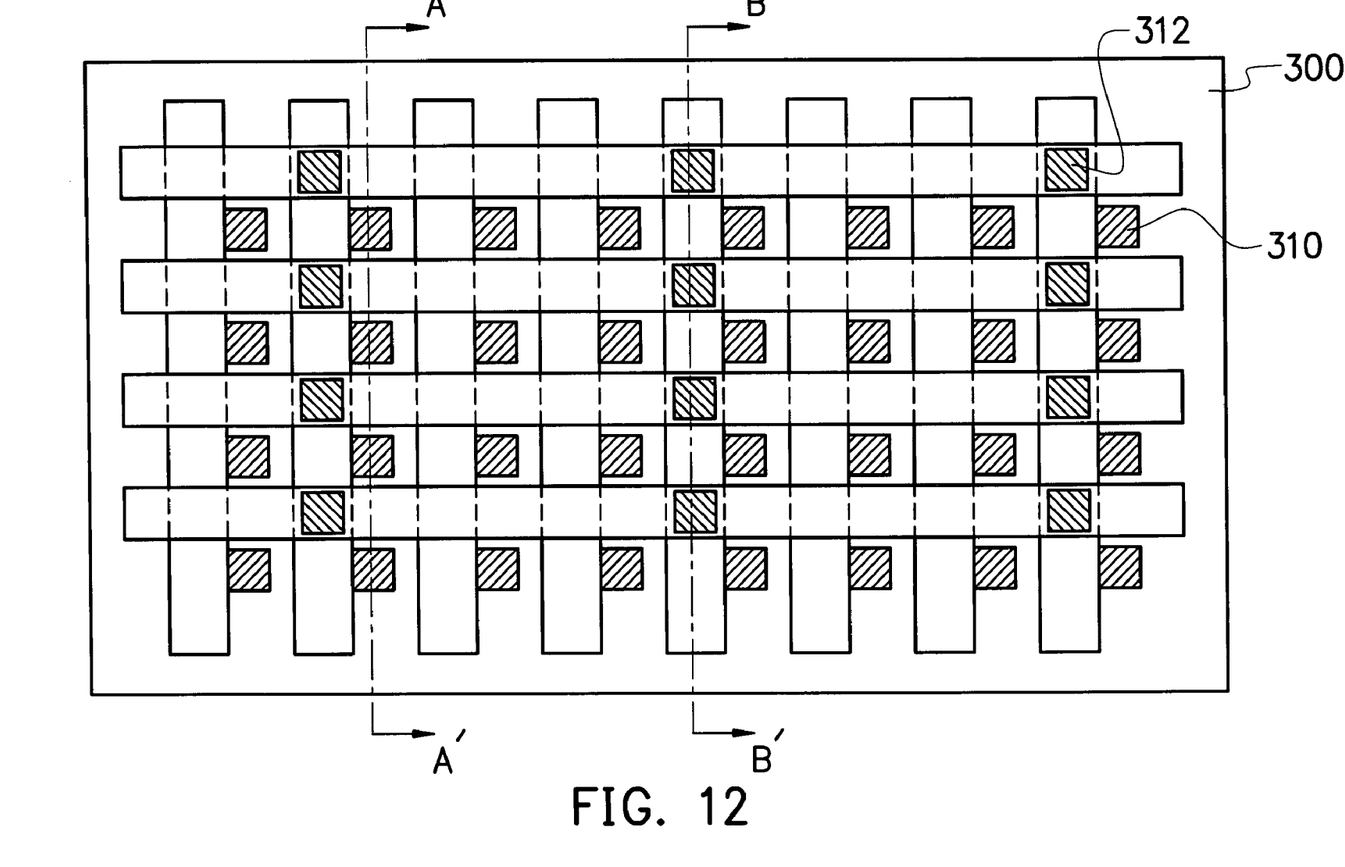

Next, referring to FIG. 12, after the formation of the cathode 308, poly solder interconnections 310 are formed on the interconnection region 302b and on an appropriate position of the cathode 308, at least a poly solder interconnection 312 is formed. The material of poly solder interconnections 310, 312, for example is silver paste. The poly solder interconnection 310 is electrically connected to the interconnection region 302b, and the poly solder interconnection 312 is electrically connected with the cathode 308. As can be clearly seen from the drawing, anode 302 is externally connected by means of the poly solder interconnection 310 to the interconnection region 302b, and the cathode 308 is externally connected by the poly solder interconnection 312. Further, the poly solder interconnections 310, 312 for example are in area array.

Figure 13A:
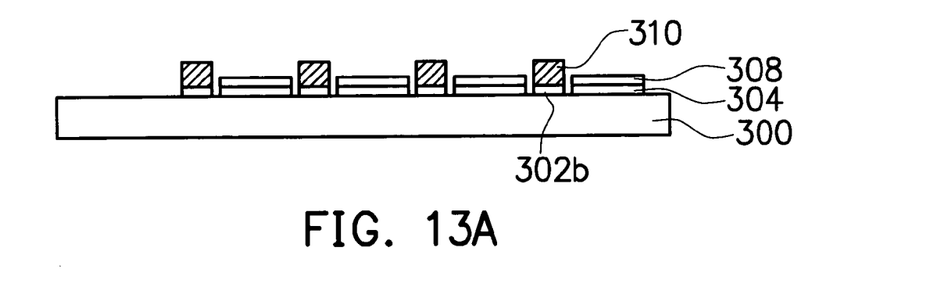
FIGS. 13A and 13B schematically show sectional view of OEL of the second preferred embodiment of the present invention.
Figure 13B:
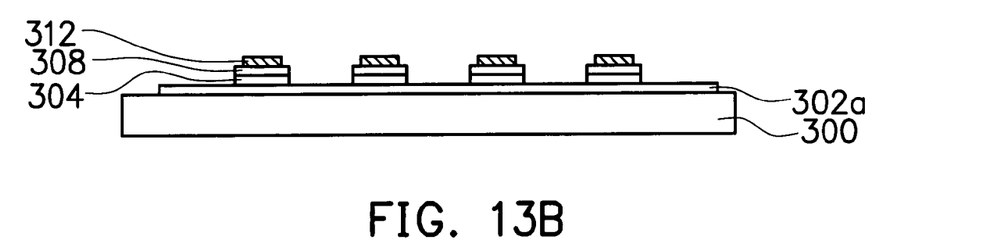

Next, referring to FIGS. 13A and 13B, there is shown schematically a sectional view of the OEL of the second preferred embodiment. FIG. 13A shows the sectional view along line A—A of FIG. 12, and FIG. 13B shows the sectional view along line B'—B' of FIG. 12. As can be seen clearly from FIG. 13A, the interconnection region 302b of the anode 302 is externally connected by the poly solder interconnection 310, and from FIG. 13B, the cathode 308 is externally connected by the poly solder interconnection 312.

Figure 14A:
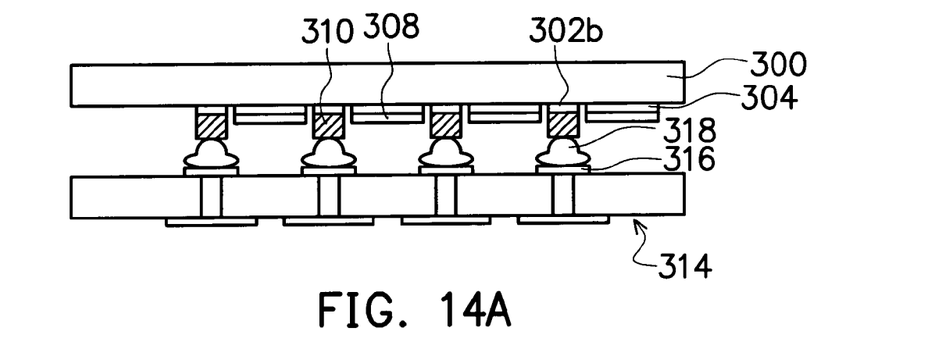
FIGS. 14A and 14B schematically show the OEL packaging structure of the second preferred embodiment of the present invention.
Figure 14B:
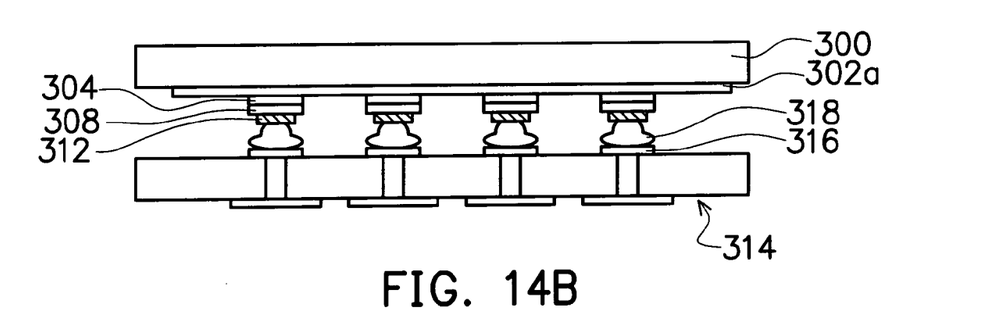

Next, referring to FIGS. 14A and 14B, there is shown a schematically sectional view of the structure of the OEL panel of the second preferred embodiment of the present invention. The structure of OEL of FIGS. 14A and 14B is similar to that of FIGS. 8A and 8B, and the difference is in the design of the organic light-emitting layer 304 of the OEL. In FIGS. 8A and 8B, an opening 306 on the organic light-emitting layer 304 exposes the interconnection region 302b, and in the present preferred embodiment, the patterned organic light-emitting layer 304 of the strip exposes the interconnection region 302b.

Referring to FIGS. 15A to 15D, there are shown sectional views of the structure of the OEL in accordance with the first and the second preferred embodiment of the present invention. In the first and second preferred embodiment, only a single layer OEL panel is used for description (i.e., an organic light-emitting layer 304 being positioned between the anode 302 and the cathode 308), however, to those skilled in the art, the OEL panel of the present invention can be an OEL panel with multiple layers.

Figure 15A:
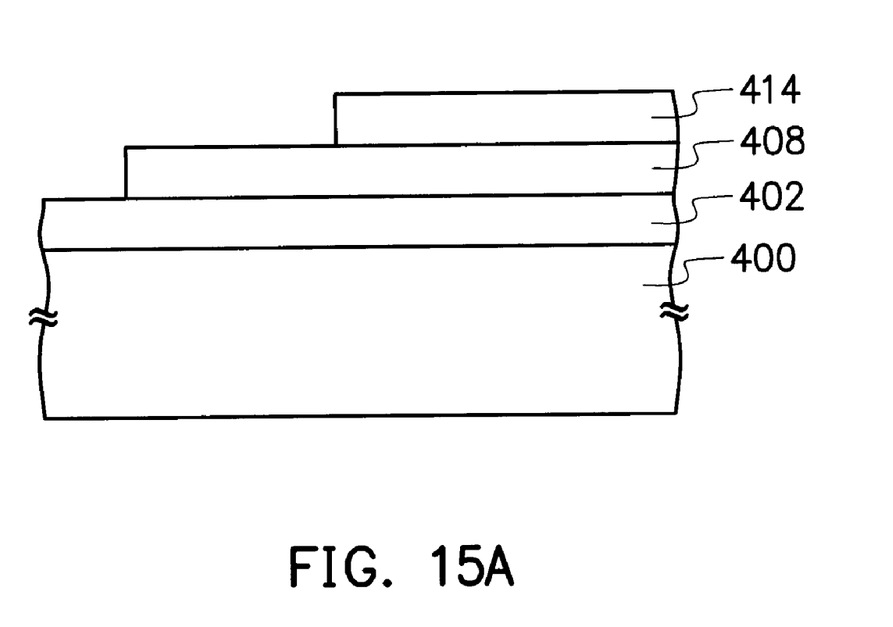
FIGS. 15A and 15D schematically show the OEL structure of the first and second preferred embodiment of the present invention.
Figure 15B:
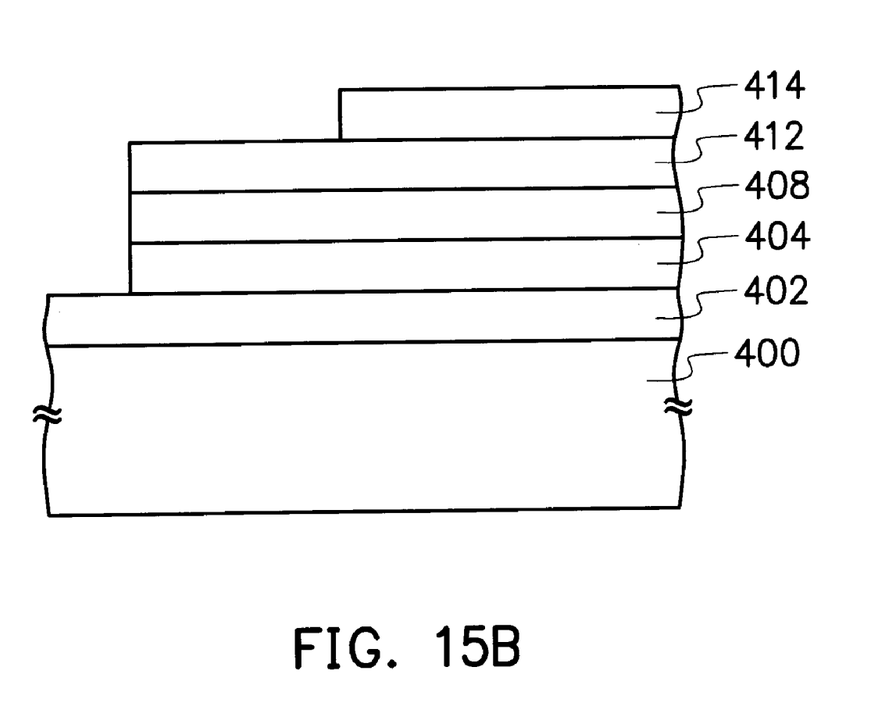
Figure 15C:
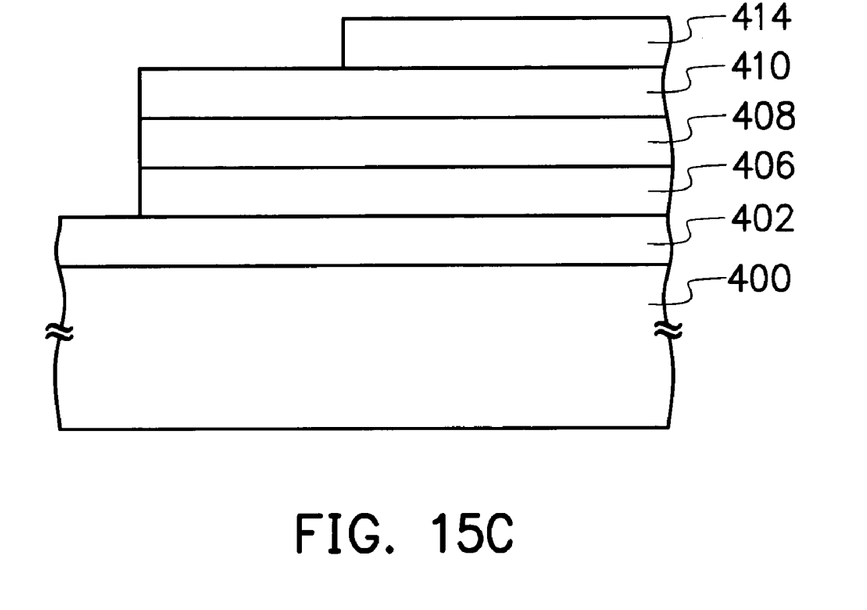
Figure 15D:
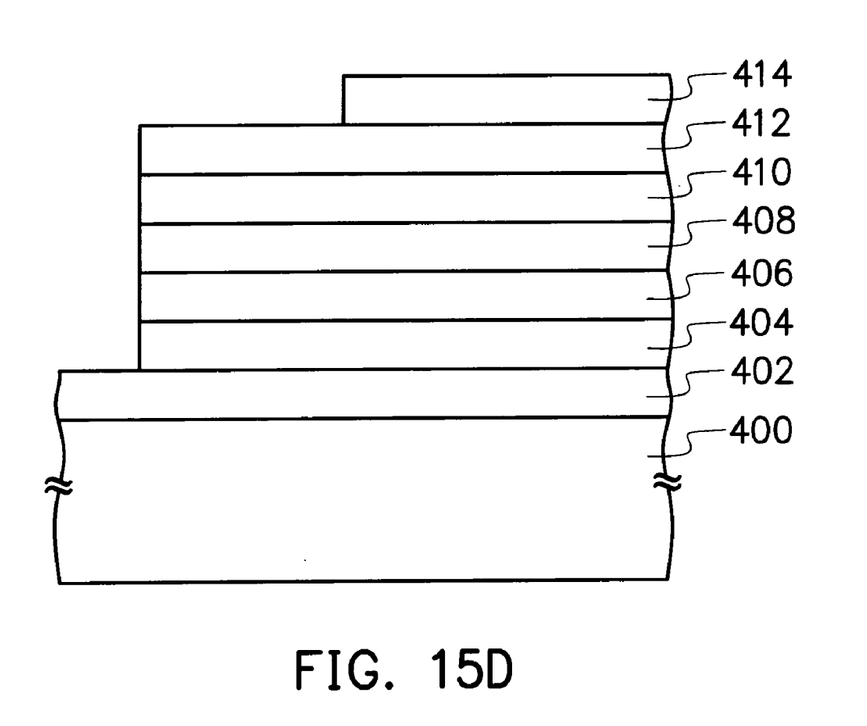

As shown in FIG. 15A, the OEL panel is formed on a transparent substrate 400, and the transparent substrate 400 is provided with anode 402, organic light-emitting layer 408 and cathode 414, which is a single layered structure panel (only a single layer between the anode 402 and the cathode 414). The OEL panel shown in FIG. 15B is provided with an anode 402, hole injection layer 404, organic light-emitting layer 408, electron injection layer 412 and cathode 412 tri-layered structure. FIG. 15C shows an OEL panel provided with an anode 402, hole transmitting layer 406, organic light-emitting layer 408, electron transmitting layer 410 and cathode 414 tri-layered structure. The OEL panel shown in FIG. 15D is provided with a five-layered panel with an anode 402, hole injection layer 404, electron transmitting layer 406, organic light-emitting layer 408, electron transmitting layer 410, electron injection layer 412 and cathode 414.

In view of the above, the advantages of the packaging structure of OEL and the fabrication thereof are as follows:

(1) In accordance with the packaging fabrication of OEL panels, a plurality of panels can be integrated onto a single printed circuit board such that the large size of OEL in display is more practical.
(2) In accordance with the packaging fabrication of OEL panels, the low re-flow temperature of poly solder interconnections causes the bonding between the OEL and the printed circuit board to be completed under 100 degree C., which is in compliance with the requirement of low temperature fabrication of OEL.
(3) In accordance with the packaging fabrication of OEL panel, the utilization of ceramic printed circuit board is beneficial to the heat dissipation mechanism of an OEL module.
(4) In accordance with the packaging fabrication of OEL panels, the connection between bumps and poly solder interconnections reduces greatly the circuit path, which is beneficial to the thinness and lightness of the OEL module.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating organic electroluminescence panel comprising the steps of providing a substrate;

forming a plurality of first electrodes on the substrate, wherein the first electrode includes a driving region and at least an interconnection region and the interconnection region is protruded from the driving region;

forming at least a patterned organic light-emitting layer on the substrate, wherein the patterned organic light-emitting layer exposes the interconnection region;

forming a hole injection layer between the first electrodes and the organic light-emitting layer after the formation of the first electrodes but before the formation of the light-emitting layer;

forming a plurality of second electrodes on the organic light-emitting layer; and forming a plurality of poly solder interconnections on the interconnection region and on the second electrodes.

2. The method of claim 1, further comprising the step of forming a hole transmitting layer between the hole injection layer and the organic light-emitting layer after the formation of the electron injection layer but before the formation of the light emitting layer.

3. The method of claim 1, further comprising the step of forming an electron transmitting layer between the organic light-emitting layer and the second electrode after the formation of the organic light-emitting layer but before the formation of the second electrodes.

4. The method of claim 3, further comprising the step of forming an electron injection layer between the electron transmitting layer and the second electrodes after the formation of the electron transmitting layer but before the formation of the cathode.

5. The method of claim 1, wherein the poly solder interconnections include low re-flow temperature materials.

6. The method of claim 1, wherein the poly solder interconnections are in area array.

* * * * *